(12) United States Patent
Yamakage et al.

(10) Patent No.: US 9,428,832 B2
(45) Date of Patent: Aug. 30, 2016

(54) HEAT EQUALIZER

(71) Applicant: TOSHIBA MITSUBISHI-ELECTRIC INDUSTRIAL SYSTEMS CORPORATION, Tokyo (JP)

(72) Inventors: Hisaaki Yamakage, Tokyo (JP); Yoshihito Yamada, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 312 days.

(21) Appl. No.: 14/041,353

(22) Filed: Sep. 30, 2013

(65) Prior Publication Data

US 2014/0026826 A1 Jan. 30, 2014

Related U.S. Application Data

(62) Division of application No. 12/935,480, filed as application No. PCT/JP2008/057204 on Apr. 11, 2008, now Pat. No. 8,724,973.

(51) Int. Cl.
- *C23C 16/448* (2006.01)
- *C23C 14/24* (2006.01)
- *F22B 1/16* (2006.01)

(52) U.S. Cl.
CPC ......... *C23C 16/4485* (2013.01); *C23C 14/243* (2013.01); *F22B 1/16* (2013.01)

(58) Field of Classification Search
CPC combination set(s) only.
See application file for complete search history.

(56) References Cited

U.S. PATENT DOCUMENTS

| | | | |
|---|---|---|---|
| 2,447,789 A | 8/1948 | Barr | |
| 2,595,527 A | 5/1952 | Kells et al. | |
| 4,052,588 A * | 10/1977 | Nakamura | A47K 10/06 219/220 |
| 4,506,654 A * | 3/1985 | Zellweger | A47J 36/30 126/261 |
| 4,534,312 A | 8/1985 | Shinya et al. | |

(Continued)

FOREIGN PATENT DOCUMENTS

| | | |
|---|---|---|
| JP | 59-107074 | 6/1984 |
| JP | 63-270456 | 11/1988 |

(Continued)

OTHER PUBLICATIONS

International Search Report issued Jul. 15, 2008 in PCT/JP08/57204 filed Apr. 11, 2008.

*Primary Examiner* — Dana Ross
*Assistant Examiner* — Renee L Larose
(74) *Attorney, Agent, or Firm* — Oblon, McClelland, Maier & Neustadt, L.L.P

(57) ABSTRACT

A heat equalizer includes a container structure, a material feed pipe, and a heating mechanism. The container structure includes an inner container and an outer container. In the outer container, a working fluid is held. Respective upper ends of the inner container and the outer container are joined to form a hollow portion between the inner container and the outer container. The material feed pipe extends from an outside of the container structure to the inner surface of the inner container. The heating mechanism is placed at the bottom of the outer container. At the bottom surface of the inner container, a plurality of protrusions protruding toward the inside of the inner container and depressions formed by the bottom surface depressed inward of the protrusions and capable of receiving the vaporized working fluid are formed.

6 Claims, 11 Drawing Sheets

(56) References Cited

U.S. PATENT DOCUMENTS

| | | | | |
|---|---|---|---|---|
| 4,829,154 A | * | 5/1989 | Teshima | H05B 3/84 |
| | | | | 219/209 |
| 5,343,012 A | | 8/1994 | Hardy et al. | |
| 5,417,408 A | | 5/1995 | Ueda | |
| 5,421,895 A | * | 6/1995 | Tsubouchi | B01D 1/14 |
| | | | | 118/726 |
| 5,471,975 A | * | 12/1995 | Wilke | F23D 14/125 |
| | | | | 126/343.5 A |
| 5,553,188 A | * | 9/1996 | Ewing | B01D 1/0011 |
| | | | | 122/40 |
| 6,132,512 A | | 10/2000 | Horie et al. | |
| 2007/0077357 A1 | * | 4/2007 | Jeong | C23C 14/243 |
| | | | | 427/248.1 |
| 2011/0041768 A1 | * | 2/2011 | Ohmi | C23C 14/12 |
| | | | | 118/726 |

FOREIGN PATENT DOCUMENTS

| | | |
|---|---|---|
| JP | 2-93063 | 4/1990 |
| JP | 9-321035 | 12/1997 |
| JP | 10-226885 | 8/1998 |
| JP | 2003-147510 | 5/2003 |
| JP | 2004-315898 | 11/2004 |
| WO | 2007-034790 | 3/2007 |

* cited by examiner

HEAT EQUALIZER

CROSS-REFERENCE TO RELATED APPLICATIONS

This application is a division of and claims the benefit of priority under 35 U.S.C. §120 from U.S. Ser. No. 12/935,480 filed Sep. 29, 2010, the entire contents of which is incorporated herein by reference. U.S. Ser. No. 12/935,480 is a National Stage of PCT/JP08/57204 filed Apr. 11, 2008 which was not published under PCT Article 21(2) in English.

TECHNICAL FIELD

The present invention relates to a heat equalizer, and particularly to a heat equalizer for heating a material that is a predetermined material carried in a container.

BACKGROUND ART

Regarding conventional organic EL (Electro-Luminescence) production, for example, when a film is to be formed on a substrate using an organic EL material in the form of powder, an evaporation apparatus for the organic EL material generally uses a heating system of heating the exterior of a container by means of a heater to sublimate or to melt and evaporate the organic material in the container. A conventional apparatus used for such heat treatment is disclosed for example in Japanese Patent Laying-Open No. 2004-315898 (Patent Document 1).

FIG. 15 is a schematic configuration diagram for illustrating a conventional evaporation apparatus. FIG. 15 shows an evaporation source for the evaporation apparatus that is characterized by that a container (crucible) 31 in which a material is held is heated by a heater 32 placed on the outer periphery, and a heat equalizing lid 37 including an auxiliary heating unit 33 and a conduction heating unit 34 extending continuously from the auxiliary heating unit is provided at an upper portion of container 31, separately from heater 32 on the outer periphery, so that the temperature around an evaporation opening 35 at the upper portion of container 31 is increased.

Patent Document 1: Japanese Patent Laying-Open No. 2004-315898

DISCLOSURE OF THE INVENTION

Problems to be Solved by the Invention

The conventional evaporation apparatus shown in FIG. 15 has heat equalizing lid 37 provided at the upper portion of container (crucible) 31 for the purpose of preventing evaporation opening 35 and therearound located at the upper portion of container 31 from being clogged with a vapor-deposition material 36 due to a temperature decrease around evaporation opening 35. Because this system, however, heats the outer surface of container 31 by means of heater 32, the inner surface of container 31 with which the vapor-deposition material is in contact has a temperature distribution depending on the condition of contact with heater 32. A resultant problem is therefore that the vapor-deposition material cannot be kept at a uniform temperature over the inner surface of container 31. For example, although Patent Document 1 shows temperature rise curves in connection with an embodiment, certain portions of container 31 do not uniformly increase in temperature and, even in a stable state, a temperature difference of approximately 30° C. still remains between the surface of container 31 and heat equalizing lid 37.

The conventional evaporation apparatus has another problem that it takes some time for the temperature of each portion of the apparatus to become stable. For example, in an illustrated embodiment of Patent Document 1, it takes three or more hours for the temperature to become stable.

In the conventional evaporation apparatus, a melt of the vapor-deposition material has a temperature difference in the melt, resulting in a problem that the material is not uniformly evaporated. Specifically, while the material in contact with the wall surface of the container is immediately heated to be evaporated, a melt of the material in a central portion of the container which is located away from the wall surface of the container has its temperature increasing at a slower rate and thus evaporation of the material is delayed. Further, due to the influence of convection occurring to the melt of the material in the container, the melt has a considerable temperature distribution. Thus, the temperature of the melt of the material cannot be controlled so that the temperature is uniform over the entire inner space of the container, and the amount of evaporation of the vapor-deposition material cannot be controlled precisely, resulting in a problem that the apparatus is not suitable for a precise film-forming process.

The present invention has been made to solve the above-described problems, and an object of the invention is to obtain a heat equalizer that improves the uniformity of the temperature of a material to be heated in a container and thereby causes the material to be vaporized stably.

Means for Solving the Problems

A heat equalizer according to an aspect of the present invention includes a container structure, a material feed pipe, and heating means. The container structure has an inner container and an outer container. In the outer container, a working fluid is held. Respective upper ends of the inner container and the outer container are joined to form a hollow portion between the inner container and the outer container. The material feed pipe extends from an outside of the container structure to an inner surface of the inner container. The heating means is placed at a bottom of the outer container. At a bottom surface of the inner container, a plurality of protrusions protruding toward an inside of the inner container, and depressions formed by the bottom surface depressed inward of the protrusions and capable of receiving a vaporized working fluid are formed.

A heat equalizer according to another aspect of the present invention includes a container structure, a material feed pipe, and heating means. The container structure has a heating block and an outer container. The heating block has a flow path formed so that a material to be heated flows in the flow path. In the outer container, a working fluid is held. Respective upper ends of the heating block and the outer container are joined to form a hollow portion between the heating block and the outer container. The material feed pipe allows an outside of the container structure and the heating block to communicate with each other. The heating means is placed at a bottom of the outer container. The flow path for the material to be heated includes a first flow path connected to the material feed pipe and extending in a horizontal direction, a second flow path branching from the first flow path and extending in a vertical direction, and an opening formed by the second flow path opening at an upper surface of the container structure. At a bottom surface of the heating block, a plurality of depressions formed by the bottom surface depressed toward an inside of the heating block and capable of receiving a vaporized working fluid are formed. The second flow path is placed between the depressions adjacent to each other.

A heat equalizer according to still another aspect of the present invention includes a container structure, heating means, and a pipe channel. The container structure includes an outer container. The outer container has a closed space which is formed in the outer container and in which a working fluid is held. The heating means is placed at a bottom of the outer container. In the pipe channel, a material to be heated flows. The pipe channel includes a material feed pipe allowing an outside and an inside of the container structure to communicate with each other. The pipe channel also includes a main header pipe connected to the material feed pipe and extending in a horizontal direction. The pipe channel further includes branch header pipes branching from the main header pipe and extending in the horizontal direction. The pipe channel further includes a plurality of riser pipes branching from the branch header pipes and opening at an upper surface of the container structure.

Effects of the Invention

According to the present invention, a gaseous working fluid is cooled to be condensed on the inner wall surface of the depressions formed at the inner container, so that the inner container is heated, and the temperature of the heated inner container is equalized. A material to be heated is heated while flowing in the inner container. Since the temperature of the inner container is equalized, the material to be heated is heated on a heating surface with a uniform temperature. The uniformity of the temperature of the material that has been heated to be vaporized can thus be improved. The amount of vaporization of the material to be heated can be controlled precisely. Accordingly, the heat equalizer applicable to a vapor deposition apparatus for forming a film with high precision can be obtained.

Figure 1:
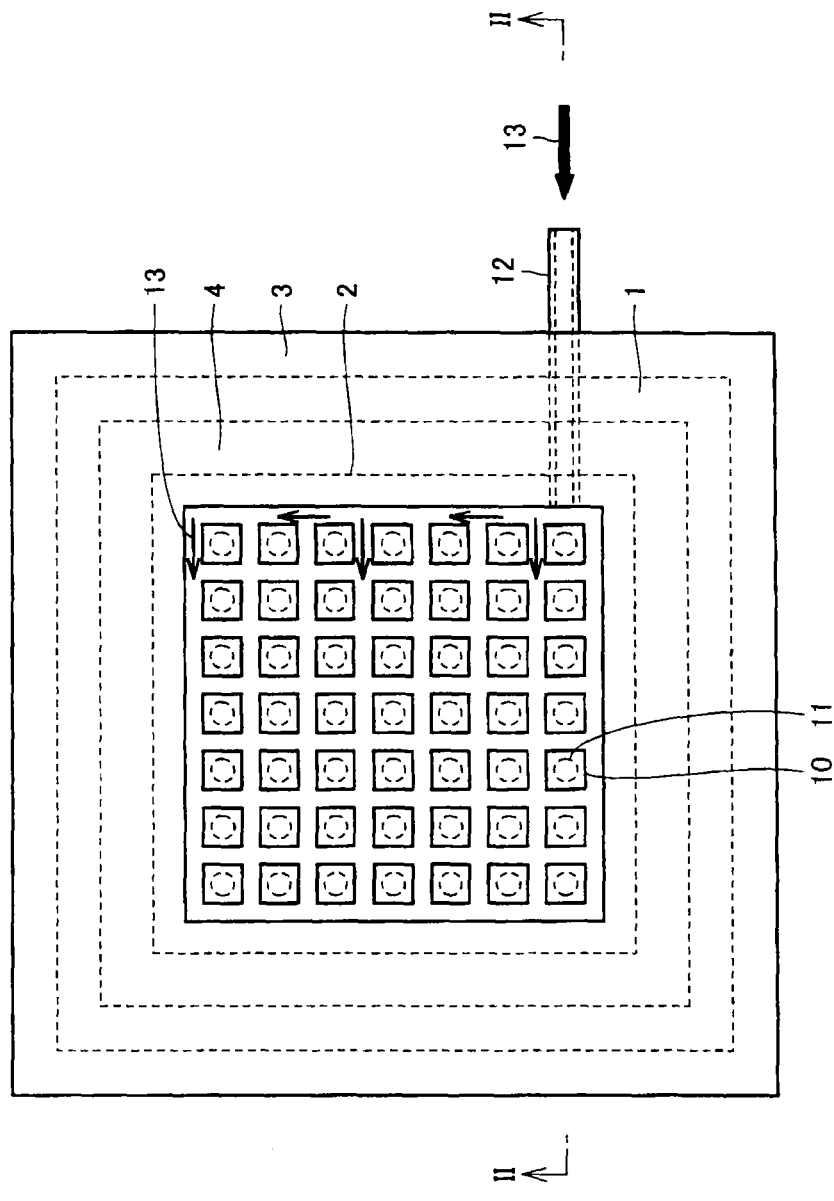
FIG. 1 is a plan view of an upper portion of a heat equalizer in a first embodiment.

DESCRIPTION OF THE REFERENCE SIGNS 1 outer container; 2 inner container; 3 flange; 4 hollow portion; 5 working fluid; 6 heating means; 7 vapor bubble; 8, 9, 13 arrow; 10, 14 protrusion; 11, 15, 20, 21 depression; 12 material feed pipe; 16 heating block; 17 main header pipe; 18 branch header pipe; 19 riser pipe; 19a opening; 22 fin body; 23 boiling promoter; 24 heater housing tube; 25 heater; 26 heat generating portion; 27 fin body; 28 boiling promoter

BEST MODES FOR CARRYING OUT THE INVENTION

Embodiments of the present invention will hereinafter be described based on the drawings. In the following drawings, the same or corresponding parts are denoted by the same reference characters, and a description thereof will not be repeated.

It should be noted that each component in the embodiments described below is not necessarily requisite to the present invention unless otherwise noted. Further, the number, quantity or the like specified in the following embodiments is only by way of illustration unless otherwise noted, and the scope of the present invention is not necessarily limited to the specified number, quantity or the like.

First Embodiment

Figure 2:
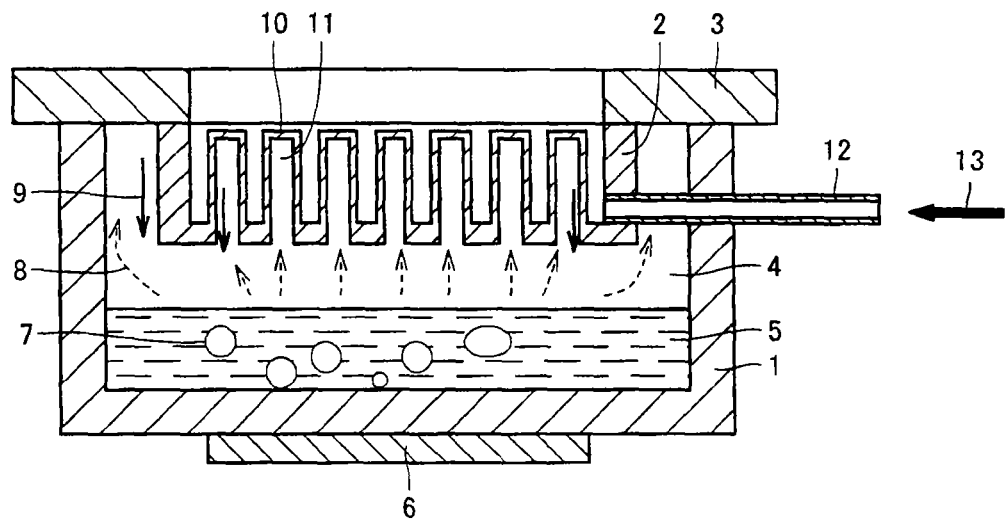
FIG. 2 is a cross section of the heat equalizer along line II-II shown in FIG. 1.

FIG. 1 is a plan view of an upper portion of a heat equalizer in a first embodiment. FIG. 2 is a cross section of the heat equalizer along line II-II shown in FIG. 1. In the following embodiments, "horizontal direction" refers to the lateral direction in cross sections of the heat equalizer, and "vertical direction" refers to the top-bottom direction in these cross sections.

As shown in FIGS. 1 and 2, the heat equalizer includes an outer container 1 and an inner container 2. Outer container 1 is placed to surround the periphery of inner container 2. The heat equalizer also includes a flange 3. Outer container 1 and inner container 2 have respective upper ends joined to flange 3 to form a container structure having a hollow portion 4 that is a closed space formed between inner container 2 and outer container 1.

At a bottom surface of inner container 2, a plurality of protrusions 10 protruding toward the inside of inner container 2 are formed. Protrusions 10 are formed to protrude upward from the bottom surface of inner container 2. As shown in FIG. 1, protrusions 10 are each formed so that the shape in plan view is substantially a square, and are arranged so that a plurality of columns of square protrusions and a plurality of rows of square protrusions are disposed on the bottom surface of inner container 2. In FIG. 1, in a gap between protrusions 10 adjacent to each other, the bottom surface of inner container 2 is exposed.

At the bottom surface of inner container 2, depressions 11 are formed by the bottom surface depressed inward of protrusions 10. Depressions 11 formed in a plurality of protrusions 10 are each an opening having its lower end open toward hollow portion 4 and having its upper end closed. Namely, depression 11 is a blind hole without extending through to the other side. The deepest portion of the blind hole shape of depression 11 is the upper end of depression 11. Depression 11 is a circular hole having a circular cross section along the radial direction of the hole, and also a linear hole extending linearly in its depth direction. The depth direction of depression 11 is along the vertical direction.

In hollow portion 4, a working fluid 5 that is a liquid working fluid is held. The working fluid is a heat medium used for transferring heat between heating means, which serves as a heat source, and inner container 2, so as to heat inner container 2 and thereby control the temperature so that the temperature is set at a target temperature. Working fluid 5 is selected in consideration of thermal properties and the operating pressure (vapor pressure) at a temperature in use. In general, water is used as the working fluid for a temperature range of approximately not more than 200° C., and an organic heat medium of a high boiling point such as Dowtherm® A and naphthalene is used as the working fluid for a high temperature range of approximately higher than 200° C. and not more than 400° C.

Working fluid 5 is held in hollow portion 4 after hollow portion 4 is evacuated of air. Therefore, in hollow portion 4, a gaseous working fluid is present that is vaporized working fluid 5. Since hollow portion 4 is formed to separate outer container 1 and inner container 2 from each other, dissipation of heat from inner container 2 to the outside of the heat equalizer is substantially prevented.

At the bottom of outer container 1, heating means 6 for heating working fluid 5 is placed. Heating means 6 is attached to the lower surface of outer container 1 so that they are in thermal contact with each other. Heating means 6 is in thermal contact with the outer surface of outer container 1. Namely, the heat generated by heating means 6 can be sufficiently and efficiently transferred to working fluid 5 via the bottom of outer container 1.

The heat equalizer also includes a material feed pipe 12 that allows the outside and the inside of the container structure to communicate with each other. Material feed pipe 12 is inserted from the outside of the container structure, joined to one side of inner container 2 and extended to the inner surface of inner container 2. Material feed pipe 12 is connected to the bottom of inner container 2. A material to be heated, which is a material to be heated and vaporized by this heat equalizer, flows in material feed pipe 12 placed to extend through respective sides of outer container 1 and inner container 2, and is fed to the bottom portion of the inner side surface of inner container 2 in the heat equalizer. Depression 11 is formed so that the deepest portion of depression 11 is located at a higher level relative to the bottom portion of inner container 2 at which material feed pipe 12 is connected to inner container 2.

In order for the material to be heated to pass through tubular material feed pipe 12, the material to be heated has to be a fluid. In the case where the material to be vaporized is solid at normal temperature, the fluidity of the material can be improved by, for example, heating and thereby melting the material, or grinding the material into powder and mixing the powder with a liquid to form a slurry, so as to allow the material to pass through the inside of material feed pipe 12.

An operation of the heat equalizer will now be described. In the heat equalizer of the first embodiment configured in the above-described manner, heating means 6 installed under outer container 1 generates heat and thereby heats outer container 1. As outer container 1 is heated, working fluid 5 is heated that is retained in a working fluid retaining portion at the bottom of the container structure, namely retained in the bottom portion of hollow portion 4 formed between outer container 1 and inner container 2. An arrow 8 of the broken line indicates the flow of the working fluid in the gaseous state, and an arrow 9 of the solid line indicates the flow of the working fluid in the liquid state.

As working fluid 5 is heated to be evaporated, vapor bubbles 7 are generated in working fluid 5. A part of the working fluid that has been heated to be evaporated into the gaseous state by heating means 6 moves from the liquid surface of working fluid 5 to the outer surface of inner container 2 as indicated by broken-line arrow 8. The gaseous working fluid having moved to the outside of the side surface of inner container 2 transfers heat to the outer surface of inner container 2, and is accordingly cooled and condensed into the liquid state. The outer side surface of inner container 2 is a condensation surface on which the gaseous working fluid is condensed. The working fluid having been condensed into the liquid state spontaneously flows back to the working fluid retaining portion at the bottom of the container structure as indicated by solid-line arrow 9.

Further, a part of the gaseous working fluid moves from the liquid surface of working fluid 5 to the inside of depression 11 as indicated by broken-line arrow 8. Depression 11 is formed to be able to accept the vaporized working fluid. The gaseous working fluid having moved into depression 11 transfers heat to the inner wall surface of depression 11, and is accordingly cooled and condensed into the liquid state. The inner wall surface of depression 11 is a condensation surface on which the gaseous working fluid is condensed. The working fluid having been condensed into the liquid state also spontaneously flows back to the working fluid retaining portion at the bottom of the container structure as indicated by solid-line arrow 9.

In this way, the outer surface of inner container 2 and the inner surface of depressions 11 formed at the bottom surface of inner container 2 are heated through the evaporation and condensation of the working fluid. This heating causes the side surface portion of inner container 2 and the surface of protrusions 10 to be heated.

As for the material to be heated that is a predetermined material, the material proceeds as indicated by an arrow 13 from the outside of the container structure through material feed pipe 12 to the bottom portion of inner container 2, and the material is fed to the gap between protrusions 10 formed in inner container 2. While passing in inner container 2, the material to be heated is heated from the side portion of inner container 2 and the side portion of protrusions 10. Namely, the material to be heated that is supplied through material feed pipe 12 into inner container 2 is heated through heat exchange with working fluid 5 heated to be evaporated into the gaseous state by heating means 6.

Over an almost entire bottom surface of inner container 2, a plurality of protrusions 10 are formed. Therefore, the area of the heat transfer surface, which is a portion of the surface of inner container 2 and which receives heat from the evaporated working fluid and is capable of transferring the heat to the material to be heated, is increased. The area of the heat transfer surface is increased and the material to be heated flowing in inner container 2 receives heat from the increased heat transfer surface, and therefore, a temperature difference is prevented from being generated in the material to be heated that flows in inner container 2 to be heated. Namely, the uniformity of the temperature of the material to be heated can be improved.

The gap between the wall surfaces of protrusions 10 that is a gap between two protrusions 10 adjacent to each other is formed to have a dimension of approximately 2 to 3 mm. Therefore, convection of a melt of the material to be heated does not occur in inner container 2 and there is no temperature unevenness of the material to be heated in inner container 2, and thus the temperature of the material to be heated that is held in the gap between the wall surfaces can further be equalized.

In inner container 2, when the material to be heated is heated to a temperature close to the boiling point, the material to be heated is evaporated into the gaseous state. The gaseous material to be heated flows upward in the gap between protrusions 10 to the outside of inner container 2. Thus, the gaseous material to be heated that has a suppressed temperature distribution and an equalized temperature can be obtained.

As heretofore described, the heat equalizer in the first embodiment includes the container structure, material feed pipe 12, and heating means 6. The container structure has inner container 2 and outer container 1. In outer container 1, the working fluid is held. Respective upper ends of inner container 2 and outer container 1 are joined to form hollow portion 4 between inner container 2 and outer container 1. Material feed pipe 12 extends from the outside of the container structure to the inner surface of inner container 2. Heating means 6 is placed at the bottom of outer container 1. At the bottom surface of inner container 2, a plurality of protrusions 10 protruding toward the inside of inner container 2, and depressions 11 formed by the bottom surface depressed inward of protrusions 10 and capable of receiving the vaporized working fluid are formed.

Thus, condensation of the working fluid on the outer surface of inner container 2 and on the inner wall surface of depressions 11 provided to inner container 2 causes inner container 2 to be heated, and the uniformity of the temperature of heated inner container 2 is improved. The material to be heated that is heated while flowing in inner container 2 is heated on a heating surface of the uniform temperature, namely the inner side surface of inner container 2 and on the surface of protrusions 10, and thus the whole material to be heated can be uniformly vaporized. The temperature of the material having been heated can therefore be equalized. Further, the gap between protrusions 10 is made small, so that convection of the melt of the material to be heated that passes in inner container 2 can be suppressed, and the uniformity of the temperature of the material to be heated that has been heated and vaporized can further be improved.

Depression 11 is formed so that the deepest portion of depression 11 is located higher than the position where material feed pipe 12 is connected to inner container 2. Typically, material feed pipe 12 is connected to the bottom portion of inner container 2. Thus, the material to be heated that is fed from material feed pipe 12 can be retained in inner container 2 for a longer period of time, and the material to be heated passes along the surface of protrusions 10 over a greater distance along the vertical direction. The material to be heated therefore can receive heat from the larger heat transfer surface, and generation of a temperature difference in the material to be heated is further suppressed, and the uniformity of the temperature of the material to be heated can further be improved.

In this way, the temperature of the heat transfer surface of inner container 2 that heats the material to be heated can be managed so that the distribution of the temperature is within ±1° C. The temperature of the material to be heated can be precisely controlled and the amount of vaporization of the material to be heated can be controlled with high precision.

Thus, an evaporation source applicable to a vapor deposition apparatus suitable for a high-precision film forming process can be obtained.

Further, the material to be heated is spread and heated in the gaps between a large number of protrusions 10 formed at inner container 2, and the area of the heat transfer surface is therefore increased and the material to be heated can be heated over the heat transfer surface of the large area. Therefore, the efficiency in heating the material to be heated is enhanced and the thermal response when the temperature is increased is considerably improved. In addition, the thermal energy for increasing the temperature can be minimized. Thus, the heat equalizer with improved heat transfer efficiency and suitable for energy saving can be obtained.

Second Embodiment

Figure 3:
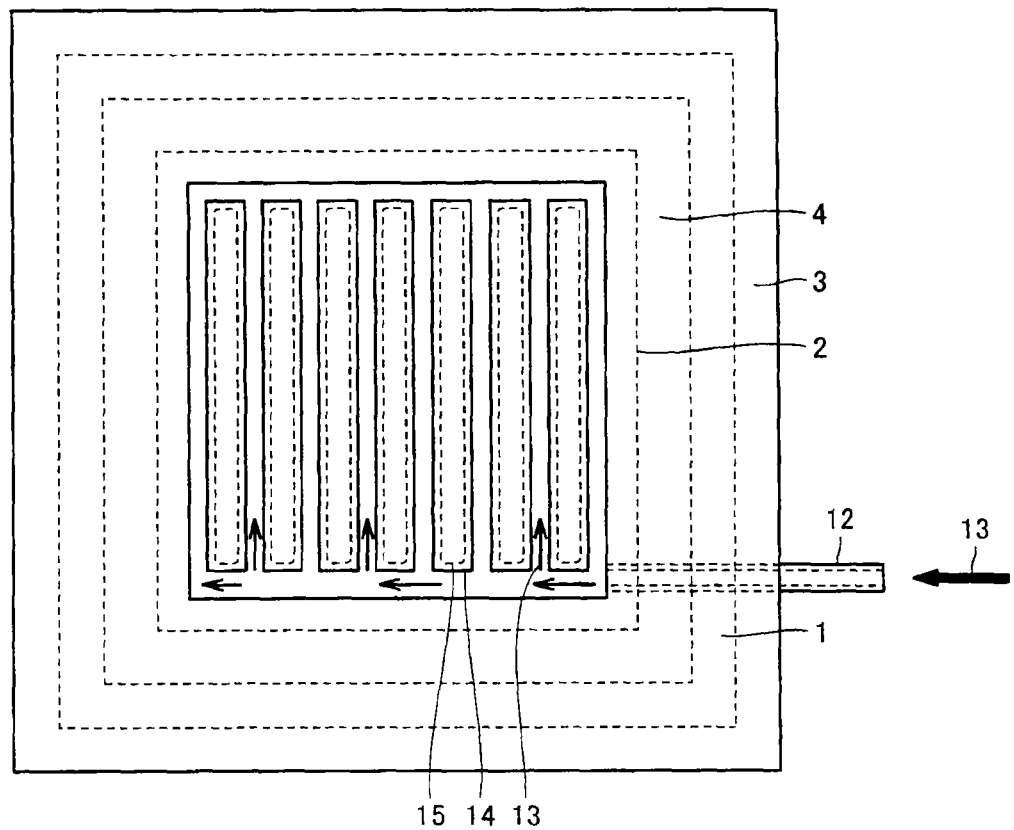
FIG. 3 is a plan view of an upper portion of a heat equalizer in a second embodiment.

FIG. 3 is a plan view of an upper portion of a heat equalizer in a second embodiment. The heat equalizer in the second embodiment differs from the heat equalizer in the first embodiment in that protrusions and depressions formed at the bottom surface of inner container 2 are shaped in the manner as shown in FIG. 3.

Specifically, while the first embodiment has been described in which a large number of protrusions 10 are formed to extend upward from the bottom surface of inner container 2, a plurality of protrusions 14 having a rectangular shape in plan view may be formed to extend upward from the bottom surface of inner container 2 as shown in FIG. 3, and depressions 15 each having the lower end communicating with hollow portion 4 may be provided in this protrusion 14. Namely, as shown in FIG. 3, protrusions 14 are each formed in the shape of a rectangular parallelepiped and are arranged in parallel to each other. Depressions 15 are each formed in the shape of a groove extending along the longitudinal direction of the shape of the rectangular parallelepiped of protrusion 14.

In the first embodiment, while the material to be heated passes in the gaps between many protrusions 10, the flow of the material may stagnate around protrusions 10 and the material may be retained there in some cases. In contrast, in the configuration of the second embodiment, the material to be heated that is fed to the bottom portion of inner container 2 can smoothly flow along the wall surface of protrusions 14 and in one direction between protrusions 14. The material to be heated can therefore be uniformly heated and evaporated along the direction of the flow of the material, and the amount of evaporation can be controlled with higher precision. As compared with the case where a large number of protrusions 10 are disposed, the number of protrusions 14 can be decreased, the number of process steps can be reduced, and the heat equalizer of low cost can be obtained.

Third Embodiment

Figure 4:
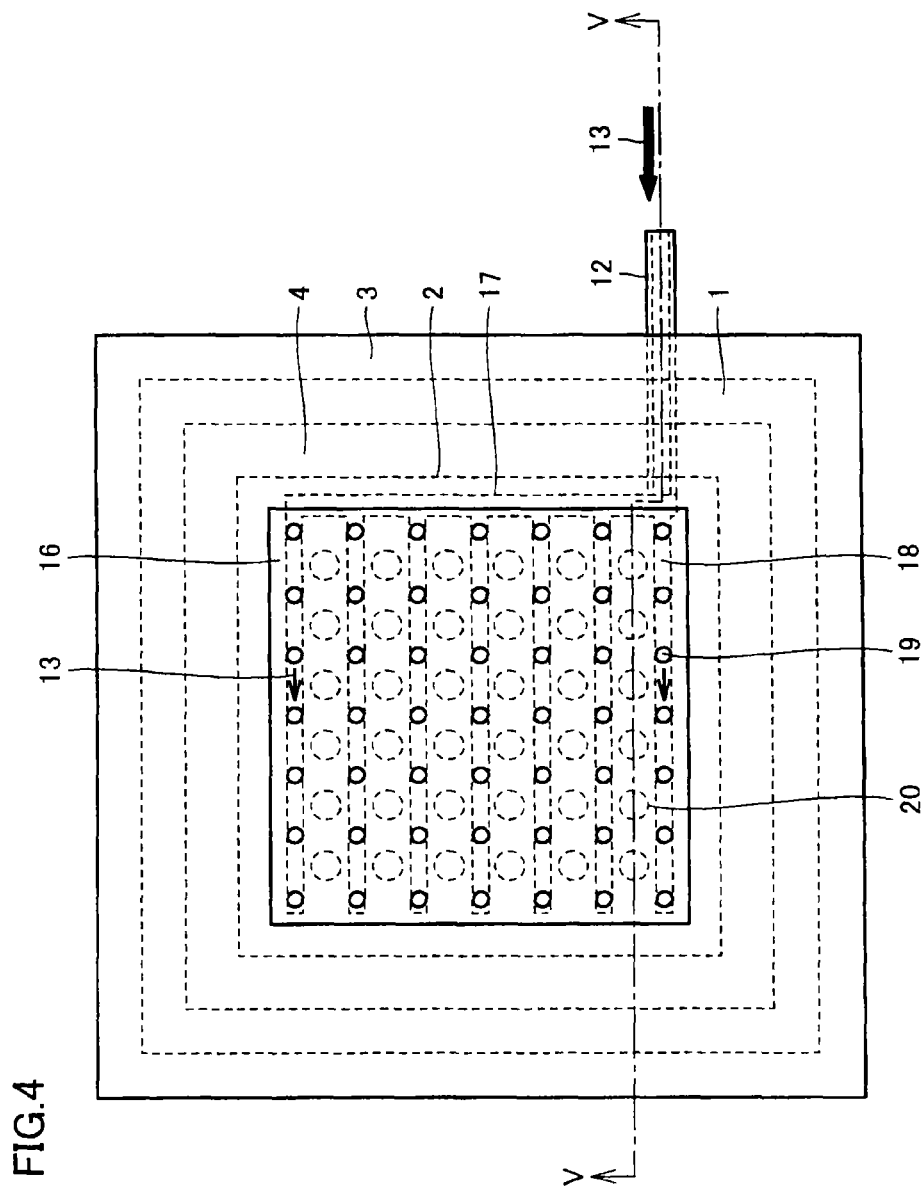
FIG. 4 is a plan view of an upper portion of a heat equalizer in a third embodiment.
Figure 5:
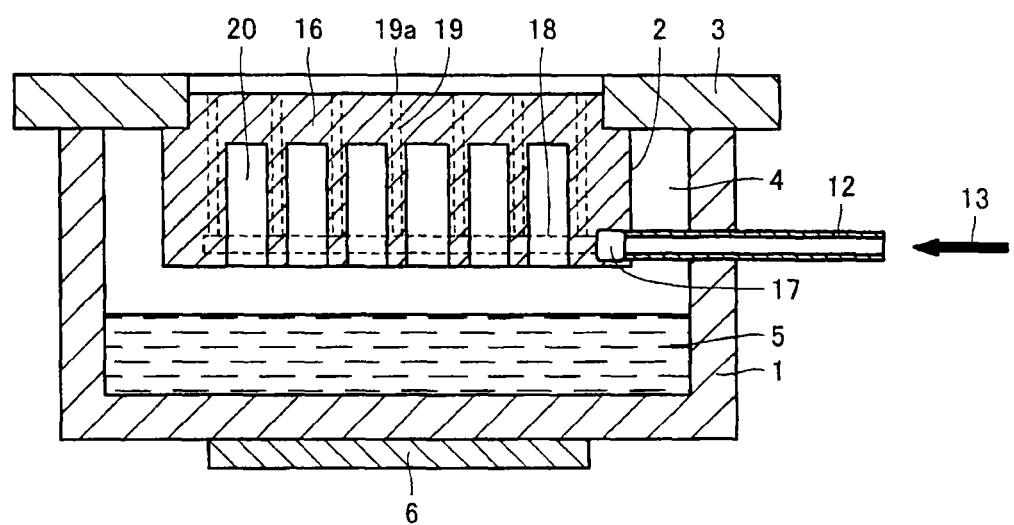
FIG. 5 is a cross section of the heat equalizer along line V-V shown in FIG. 4.

FIG. 4 is a plan view of an upper portion of a heat equalizer in a third embodiment. FIG. 5 is a cross section of the heat equalizer along line V-V shown in FIG. 4. As shown in FIGS. 4 and 5, the heat equalizer in the third embodiment includes an outer container 1 and a heating block 16. Outer container 1 is placed to surround the periphery of heating block 16.

The heat equalizer includes a flange 3. Outer container 1 and heating block 16 have respective upper ends joined to flange 3 to form a container structure having a hollow portion 4 that is a closed space formed between heating block 16 and outer container 1. As shown in FIG. 5, heating block 16 is provided at a central opening of flange 3, and the periphery of heating block 16 is joined to flange 3 to allow heating block 16 to hang in outer container 1.

Like the first embodiment, a working fluid 5 is held in hollow portion 4, and working fluid 5 is held in hollow portion 4 after hollow portion 4 is evacuated of air. At the bottom of outer container 1, heating means 6 for heating working fluid 5 is placed. The heat equalizer includes a material feed pipe 12 that allows the outside of the container structure and heating block 16 to communicate with each other.

In heating block 16, a main header pipe 17 connected to material feed pipe 12 and extending in the horizontal direction, a plurality of branch header pipes 18 branching from main header pipe 17 and extending in the horizontal direction, and a plurality of riser pipes 19 branching from branch header pipes 18 and extending in the vertical direction are processed and formed. Main header pipe 17, branch header pipes 18, and riser pipes 19 are each a hole formed in heating block 16. The upper end of riser pipe 19 is opened at the upper surface of heating block 16 to form an opening 19a. Main header pipe 17, branch header pipes 18, riser pipes 19, and openings 19a are included in a flow path in which a material to be heated flows.

At the bottom surface of heating block 16, a plurality of depressions 20 are formed by the bottom surface depressed toward the inside of heating block 16. Depressions 20 are each an opening having the lower end open to hollow portion 4 and having the upper end closed. Namely, depression 20 is a blind hole without extending through to the other side. The deepest portion of the blind hole shape of depression 20 is the upper end of depression 20. Depression 20 is a circular hole having a circular cross section along the radial direction of the hole, and also a linear hole extending linearly in its depth direction. The depth direction of depression 20 is along the vertical direction.

Depressions 20 are formed from the lower surface toward the upper surface of heating block 16 at respective positions that do not interfere with riser pipes 19. Depressions 20 are formed to extend between riser pipes 19. Depressions 20 are formed between riser pipes 19 and separated from the flow path for a material to be heated. As shown in FIG. 4, depressions 20 adjacent to each other are formed respectively on the opposite sides of riser pipe 19 to sandwich riser pipe 19. Between depressions 20 adjacent to each other, riser pipe 19 is placed.

In the heat equalizer of the third embodiment configured in the above-described manner, when outer container 1 is heated by heat generated by heating means 6, working fluid 5 retained in a working fluid retaining portion at the bottom of the container structure is heated. A part of the working fluid that is heated and evaporated into the gaseous state by heating means 6 moves to the outer surface of heating block 16. Further, a part of the gaseous working fluid moves from the liquid surface of working fluid 5 to the inside of depressions 20. Depressions 20 are formed to be able to accept the vaporized working fluid. The gaseous working fluid transfers heat to the outer surface of heating block 16 as well as the inner wall surface of depressions 20 and is accordingly cooled and condensed into the liquid state. The outer surface of heating block 16 and the inner wall surface of depressions 20 are condensation surfaces on which the gaseous working fluid is condensed. The working fluid condensed into the liquid state spontaneously flows back to the working fluid retaining portion at the bottom of the container structure.

In this way, the outer surface of heating block 16 and the inner surface of depressions 20 formed at the bottom surface of heating block 16 are heated through the evaporation and condensation of the working fluid. The outer surface of heating block 16 and the depressions 20 are included in a condensation path in which the working fluid having been heated and evaporated by heating means 6 is cooled and condensed.

As for the material to be heated that is a predetermined material, the material proceeds as indicated by an arrow 13 from the outside of the container structure through material feed pipe 12 to heating block 16, and is successively conveyed by pressure to riser pipes 19 through main header pipe 17 and then branch header pipes 18 formed in heating block 16. While passing in heating block 16, the material to be heated is heated from the side surface portion of heating block 16 and the wall surface of depressions 20 provided in heating block 16. Namely, the material to be heated that is supplied through material feed pipe 12 into heating block 16 is heated through heat exchange with the gaseous working fluid that is working fluid 5 heated and evaporated into the gaseous state by heating means 6.

At this time, riser pipe 19 is formed between two depressions 20 adjacent to each other. While the material to be heated flows in riser pipe 19, heat is transferred to the material from these depressions 20 formed respectively on the opposite sides of the riser pipe.

To the material to be heated that flows in the flow path formed in heating block 16, heat is transferred from two depressions 20 formed to sandwich the flow path. The material to be heated that is flowing in the flow path is heated from two directions opposite to each other. Because the material to be heated receives heat from multiple directions, generation of a temperature difference in the material to be heated that flows in the flow path is suppressed. Namely, the uniformity of the temperature of the material to be heated can be improved.

The inner diameters of main header pipe 17, branch header pipe 18, and riser pipe 19 are each selected so that the flow rate of the material to be heated in main header pipe 17 is sufficiently lower than the flow rate of the material to be heated in branch header pipe 18 and so that the flow rate of the material to be heated in branch header pipe 18 is sufficiently lower than the flow rate of the material to be heated in riser pipe 19. Therefore, the material to be heated that flows out of main header pipe 17 equally enters a plurality of branch header pipes 18 and likewise equally enters a plurality of riser pipes 19. Namely, the material to be heated moves in a constant flow state through a predetermined flow path, and therefore, it does not occur that the material to be heated stays at a specific part in the flow path to cause respective temperature histories at respective positions in the flow path to be different from each other. Accordingly, the temperature history of the material to be heated can be equalized and the temperature uniformity of the material after heated can be improved.

When riser pipe 19 is formed of a pipe having a small inner diameter of approximately 2 to 3 mm, convection of the melt of the material to be heated does not occur in riser pipe 19, and no temperature unevenness is generated in the material to be heated in riser pipe 19. Therefore, the temperature of the material to be heated can be further equalized.

In heating block 16, when the material to be heated is heated to a temperature close to the boiling point, the material to be heated is evaporated into the gaseous state. The gaseous material to be heated flows through opening 19a to the outside of heating block 16. Thus, the gaseous material to be heated that has a suppressed temperature distribution and an equalized temperature can be obtained.

As heretofore described, the heat equalizer in the third embodiment includes the container structure, material feed pipe 12, and heating means 6. The container structure has heating block 16 and outer container 1. In heating block 16, a flow path in which the material to be heated flows is formed. In outer container 1, a working fluid is held. Heating block 16 and outer container 1 have respective upper ends joined to form hollow portion 4 between heating block 16 and outer container 1.

Material feed pipe 12 allows the outside of the container structure and heating block 16 to communicate with each other. Heating means 6 is placed at the bottom of outer container 1. The flow path of the material to be heated includes main header pipe 17 and branch header pipes 18 connected to material feed pipe 12 and extending in the horizontal direction to serve as a first flow path, riser pipes 19 branching from the first flow path and extending in the vertical direction to serve as a second flow path, and openings 19a formed by the second flow path opening at the upper surface of the container structure. At the bottom surface of heating block 16, a plurality of depressions 20 capable of receiving the vaporized working fluid is formed by the bottom surface depressed toward the inside of heating block 16. Between depressions 20 adjacent to each other, riser pipe 19 is placed.

In this way, heating block 16 is heated through condensation of the working fluid on the outer surface of heating block 16 and on the inner wall surface of depressions 20 provided in heating block 16, and the uniformity of the temperature of heating block 16 having been heated is improved. The material to be heated that is heated while flowing in the flow path formed in heating block 16 is heated on the heating surface of a uniform temperature, namely the inner wall surface of main header pipe 17, branch header pipe 18 and riser pipe 19, and thus the whole material to be heated can be uniformly vaporized. The temperature of the material to be heated having been heated can therefore be equalized.

Further, the flow path is formed so that the material to be heated continuously flows to opening 19a from the connecting portion between the material feed pipe 12 and main header pipe 17, and the material to be heated is successively conveyed from main header pipe 17 through branch header pipe 18 to riser pipe 19 to be heated. Thus, the material to be heated does not partially stay at a part of the flow path, the material to be heated constantly flows, and the uniformity of the heating history of the material to be heated can be improved.

Furthermore, because riser pipe 19 has a small diameter, convection of the melt of the material to be heated that passes in riser pipe 19 can be suppressed, and the uniformity of the temperature of the material to be heated that has been heated and vaporized can further be improved. A large number of riser pipes 19 each having a small diameter of approximately 2 to 3 mm can be provided to increase the area of the surface transferring heat to the material to be heated. The material to be heated can thus be heated with the heat transfer surface of the large area. The efficiency in heating the material to be heated can further be improved.

The material to be heated is spread and heated in the flow path that is a network of the small diameter pipe. Accordingly, the area of the heat transfer surface is increased, and the material to be heated can be heated by means of the heat transfer surface of the large area. Therefore, the efficiency in heating the material to be heated is enhanced and the thermal response when the temperature is increased is considerably improved. In addition, the thermal energy for increasing the temperature can be minimized. Thus, the heat equalizer with improved heat transfer efficiency and suitable for energy saving can be obtained.

Fourth Embodiment

Figure 6:
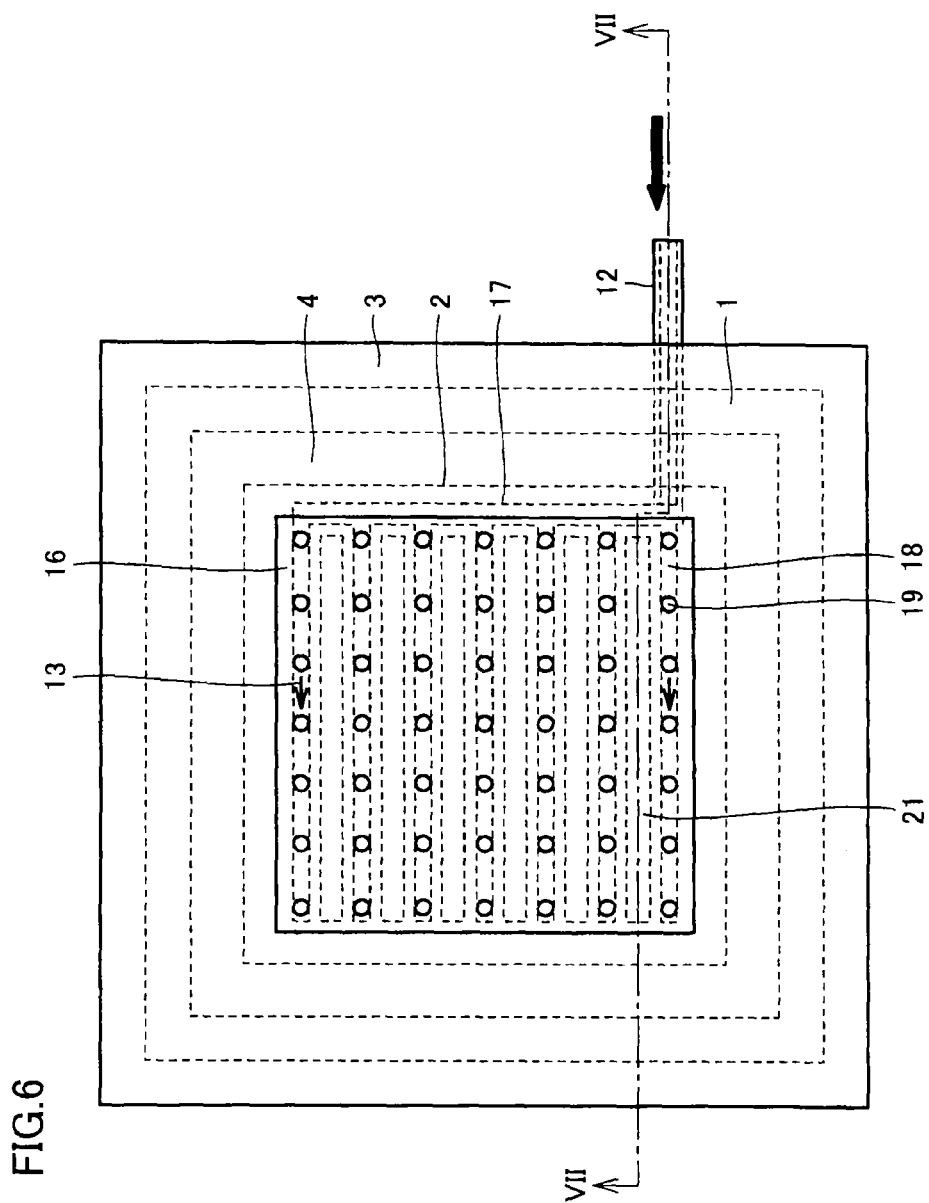
FIG. 6 is a plan view of an upper portion of a heat equalizer in a fourth embodiment.
Figure 7:
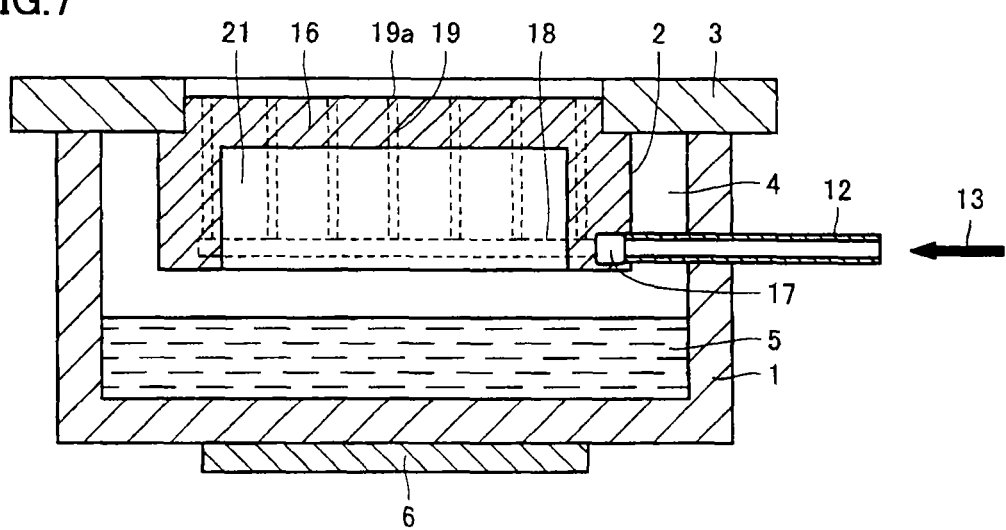
FIG. 7 is a cross section of the heat equalizer along line VII-VII shown in FIG. 6.

FIG. 6 is a plan view of an upper portion of a heat equalizer in a fourth embodiment. FIG. 7 is a cross section of the heat equalizer along line VII-VII shown in FIG. 6. The heat equalizer in the fourth embodiment differs from the heat equalizer in the third embodiment in that the depression formed at the bottom surface of heating block 16 is shaped in the manner as shown in FIGS. 6 and 7.

Specifically, the third embodiment has been illustrated in which a plurality of depressions 20 in the shape of a circular hole and having the lower end communicating with hollow portion 4 are processed at the bottom surface of heating block 16, so that the depressions do not interfere with riser pipes 19. Instead, as shown in FIGS. 6 and 7, a depression 21 having the lower end communicating with hollow portion 4 and having the shape of a blind groove may be provided from the lower surface side of heating block 16 to the inside thereof, so that the depression does not interfere with riser pipes 19. In this way, the surface area of depressions 21 on which the gaseous working fluid is condensed can be increased, the amount of heat for heating the material to be heated that flows in riser pipes 19 is increased and the heat capacity of heating block 16 can be decreased. Thus, the efficiency in heating the material to be heated can further be improved.

Fifth Embodiment

Figure 8:
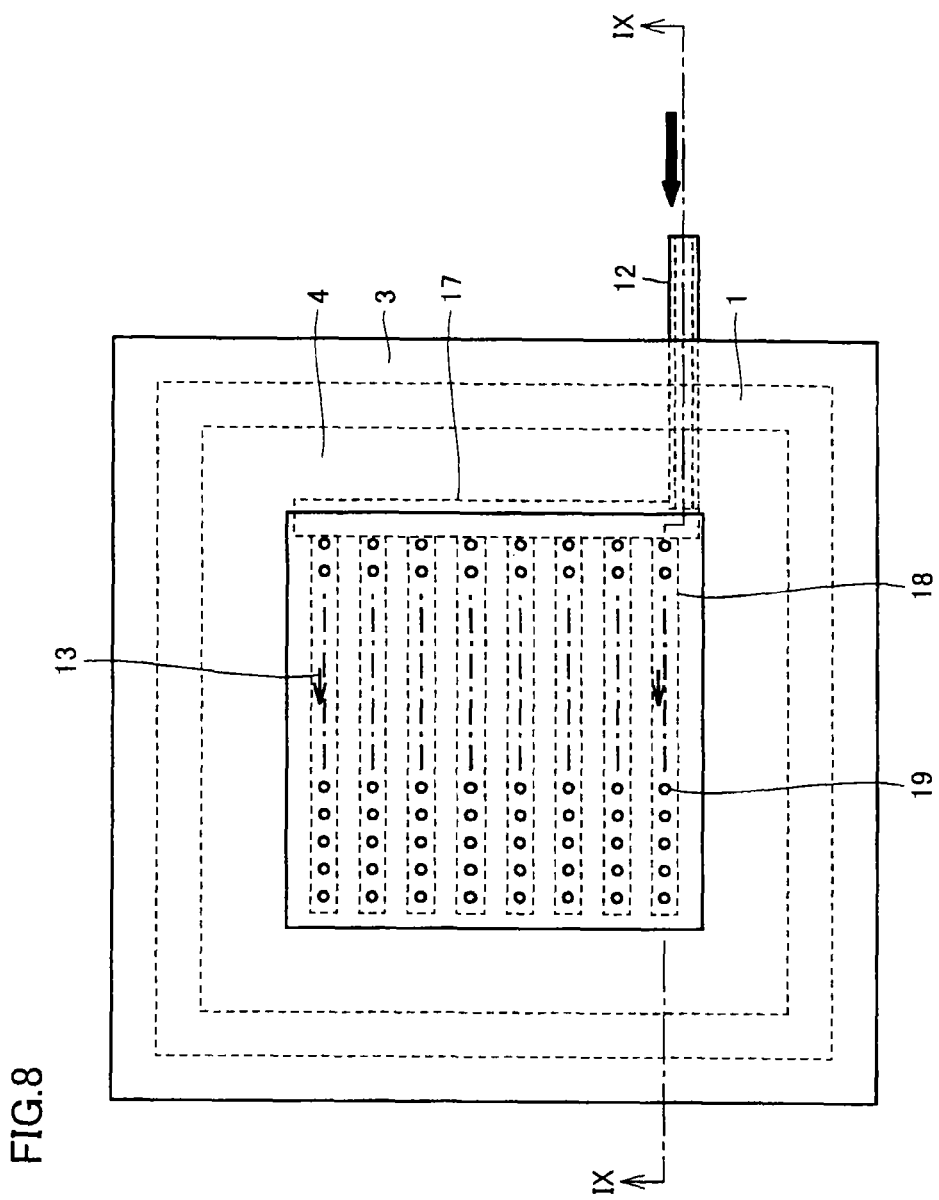
FIG. 8 is a plan view of an upper portion of a heat equalizer in a fifth embodiment.
Figure 9:
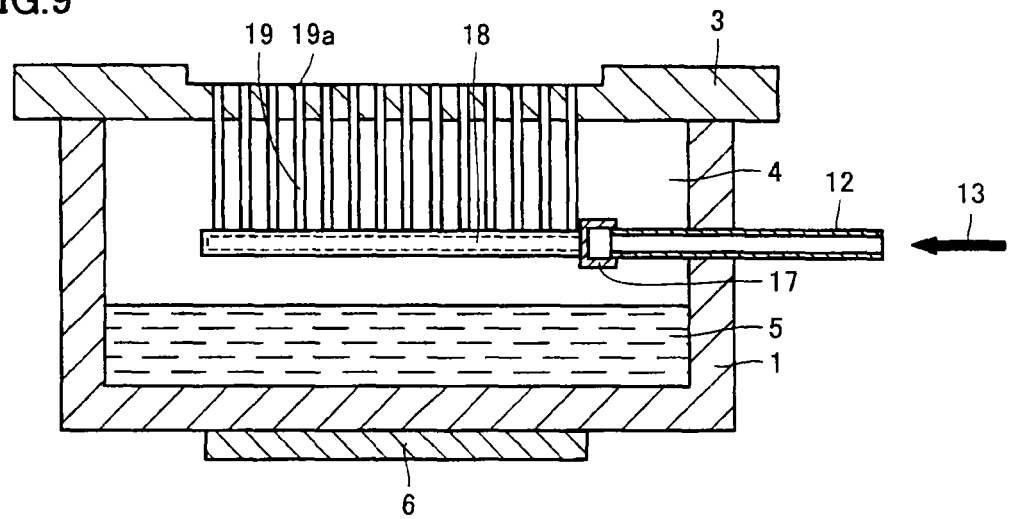
FIG. 9 is a cross section of the heat equalizer along line IX-IX shown in FIG. 8.

FIG. 8 is a plan view of an upper portion of a heat equalizer in a fifth embodiment. FIG. 9 is a cross section of the heat equalizer along line IX-IX shown in FIG. 8. As shown in FIGS. 8 and 9, the heat equalizer in the fifth embodiment includes an outer container 1 and a pipe channel in which a material to be heated flows. Outer container 1 is placed to surround the periphery of the pipe channel. The heat equalizer includes a flange 3. Outer container 1 has an upper end joined to flange 3 to form a container structure having a hollow portion 4 that is a closed space formed in outer container 1. The pipe channel is placed in hollow portion 4 formed in outer container 1.

Like the first embodiment, a working fluid 5 is held in hollow portion 4, and working fluid 5 is held in hollow portion 4 after hollow portion 4 is evacuated of air. At the bottom of outer container 1, heating means 6 for heating working fluid 5 is placed. The heat equalizer includes a material feed pipe 12 that allows the outside and the inside of the container structure to communicate with each other.

In hollow portion 4, a main header pipe 17 connected to one end of material feed pipe 12 and extending in the horizontal direction, a plurality of branch header pipes 18 branching from main header pipe 17 and extending in the horizontal direction, and a plurality of riser pipes 19 branching from branch header pipes 18 and extending in the vertical direction are processed and formed. Main header pipe 17, branch header pipes 18, and riser pipes 19 are each a tubular member. The upper end of riser pipe 19 is opened at the upper surface of flange 3 to form an opening 19a. The upper end portion of riser pipe 19 is connected to flange 3 to be opened to the outside of the container structure. Material feed pipe 12, main header pipe 17, branch header pipes 18, riser pipes 19, and openings 19a are included in the pipe channel in which the material to be heated flows.

In the heat equalizer of the fifth embodiment configured in the above-described manner, when outer container 1 is heated by heat generated by heating means 6, working fluid 5 retained in a working fluid retaining portion at the bottom of the container structure is heated. A part of the working fluid that is heated and evaporated into the gaseous state by heating means 6 moves to the surface of the pipe channel. The gaseous working fluid transfers heat to the surface of the pipe channel and is accordingly cooled and condensed into the liquid state. The surface of the pipe channel is a condensation surface on which the gaseous working fluid is condensed. The working fluid condensed into the liquid state spontaneously flows back to the working fluid retaining portion at the bottom of the container structure. In this way, the surface of the pipe channel is heated through evaporation and condensation of the working fluid.

As for the material to be heated that is a predetermined material, the material proceeds as indicated by an arrow 13 from the outside of the container structure through material feed pipe 12 to the pipe channel in hollow portion 4, and is successively conveyed by pressure to riser pipes 19 through main header pipe 17 and then branch header pipes 18. While passing in the pipe channel, the material to be heated is heated from the wall surface of the pipe channel. Namely, the material to be heated that is supplied through material feed pipe 12 into outer container 1 is heated through heat exchange with the gaseous working fluid that is working fluid 5 heated and evaporated into the gaseous state by heating means 6.

The inner diameters of main header pipe 17, branch header pipe 18, and riser pipe 19 are each selected so that the flow rate of the material to be heated in main header pipe 17 is sufficiently lower than the flow rate of the material to be heated in branch header pipe 18 and so that the flow rate of the material to be heated in branch header pipe 18 is sufficiently lower than the flow rate of the material to be heated in riser pipe 19. Therefore, the material to be heated that flows out of main header pipe 17 equally enters a plurality of branch header pipes 18 and likewise equally enters a plurality of riser pipes 19. Namely, the material to be heated moves in a constant flow state through a predetermined flow path, and therefore, it does not occur that the material to be heated stays at a specific part in the flow path to cause respective temperature histories at respective positions in the flow path to be different from each other. Accordingly, the temperature history of the material to be heated can be equalized and the temperature uniformity of the material after heated can be improved.

When riser pipe 19 is formed of a pipe having a small inner diameter of approximately 2 to 3 mm, convection of the melt of the material to be heated does not occur in riser pipe 19, and no temperature unevenness is generated in the material to be heated in riser pipe 19. Therefore, the temperature of the material to be heated can be further equalized.

In the pipe channel, when the material to be heated is heated to a temperature close to the boiling point, the material to be heated is evaporated into the gaseous state. The gaseous material to be heated flows through opening 19*a* to the outside of the container structure. Thus, the gaseous material to be heated that has a suppressed temperature distribution and an equalized temperature can be obtained.

As heretofore described, the heat equalizer in the fifth embodiment includes the container structure, heating means 6, and the pipe channel. The container structure includes outer container 1 having a closed space which is formed in the container structure and in which a working fluid is held. Heating means 6 is placed at the bottom of outer container 1. In the pipe channel, a material to be heated flows. The pipe channel includes material feed pipe 12 allowing the outside and the inside of the container structure to communicate with each other. The pipe channel also includes main header pipe 17 connected to material feed pipe 12 and extending in the horizontal direction. The pipe channel further includes branch header pipes 18 branching from main header pipe 17 and extending in the horizontal direction. The pipe channel further includes a plurality of riser pipes 19 branching from branch header pipes 18 and opening at the upper surface of the container structure.

Thus, the pipe channel which includes main header pipe 17, branch header pipes 18, and riser pipes 19 and in which the material to be heated flows is entirely brought into contact directly with the working fluid having been heated and evaporated into the gaseous state. Therefore, the whole pipe channel is efficiently heated through condensation of the working fluid, so that the efficiency in heating the material to be heated can be improved remarkably. Further, the structure of the heat equalizer can be simplified remarkably.

The pipe channel is heated through condensation of the working fluid on the outer surface of the pipe channel, and the uniformity of the temperature of the pipe channel having been heated is improved. The material to be heated that is heated while flowing in the pipe channel is heated on the heating surface of a uniform temperature, namely the inner wall surface of main header pipe 17, branch header pipe 18 and riser pipe 19, and thus the whole material to be heated can be uniformly vaporized. The temperature of the material to be heated having been heated can therefore be equalized.

Further, the flow path is formed so that the material to be heated continuously flows to opening 19*a* from the connecting portion between material feed pipe 12 and main header pipe 17, and the material to be heated is successively conveyed from main header pipe 17 through branch header pipe 18 to riser pipe 19 to be heated. Thus, the material to be heated does not partially stay at a part of the flow path, the material to be heated constantly flows, and the uniformity of the heating history of the material to be heated can be improved.

Furthermore, because riser pipe 19 has a small diameter, convection of the melt of the material to be heated that passes in riser pipe 19 can be suppressed, and the uniformity of the temperature of the material to be heated that has been heated and vaporized can further be improved. A large number of riser pipes 19 each having a small diameter of approximately 2 to 3 mm can be provided to increase the area of the surface transferring heat to the material to be heated. The material to be heated can thus be heated with the heat transfer surface of the large area. The efficiency in heating the material to be heated can further be improved.

The material to be heated is spread and heated in the pipe channel network of a small diameter. Accordingly, the area of the heat transfer surface is increased, and the material to be heated can be heated by means of the heat transfer surface of the large area. Therefore, the efficiency in heating the material to be heated is enhanced and the thermal response when the temperature is increased is considerably improved. In addition, the thermal energy for increasing the temperature can be minimized. Thus, the heat equalizer with improved heat transfer efficiency and suitable for energy saving can be obtained.

The inner surfaces of main header pipe 17, branch header pipes 18, and riser pipes 19 in which the material flows have to be polished for preventing the material from attaching to the surfaces and for pretreatment prior to surface treatment, for example. In the case of the heat equalizer in the fifth embodiment, the flow path for the material to be heated is a tubular body. Therefore, the pipe channel may be configured using a commercially available polished pipe so that the inner surface treatment can be dispensed with. Thus, the number of process steps for the flow path of the material to be heated can be considerably reduced, and the heat equalizer of low cost can be obtained.

Sixth Embodiment

Figure 10:
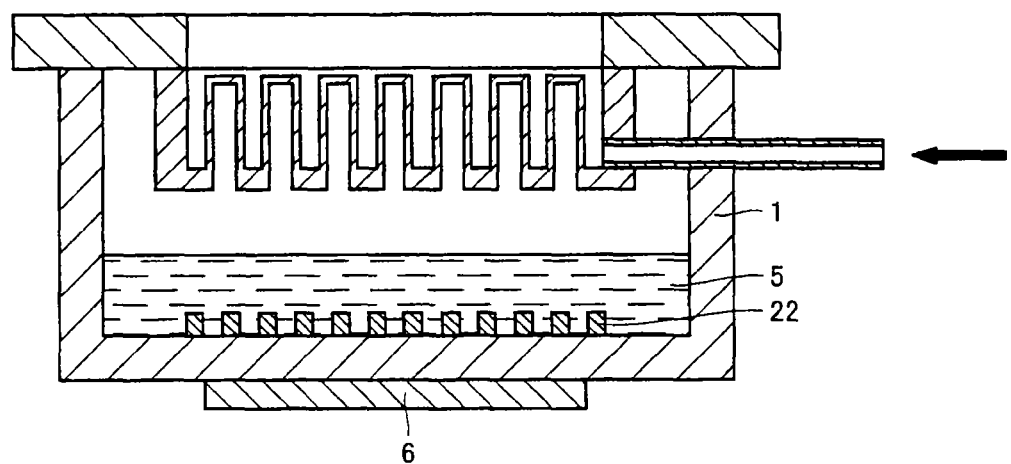
FIG. 10 is a cross section of a heat equalizer in a sixth embodiment.

FIG. 10 is a cross section of a heat equalizer in a sixth embodiment. While the first to fifth embodiments above have been described in which heating means 6 is placed under outer container 1, a fin body 22 may be provided as shown in FIG. 10 on the inner surface of the bottom of outer container 1 that corresponds to the location where heating means 6 is attached.

In this way, the area on which working fluid 5 is evaporated can be extended, and therefore boiling of working fluid 5 is promoted and the thermal response of the heat equalizer can be improved. Further, the heat of heating means 6 is speedily transferred to working fluid 5 in outer container 1. Therefore, increase of the surface temperature of outer container 1 is suppressed and, in the vicinity of heating means 6, overheating of outer container 1 can be prevented. In addition, the amount of heat dissipation from the container structure to the peripheral area is reduced. Accordingly, the energy-saving heat equalizer can be obtained.

Seventh Embodiment

Figure 11:
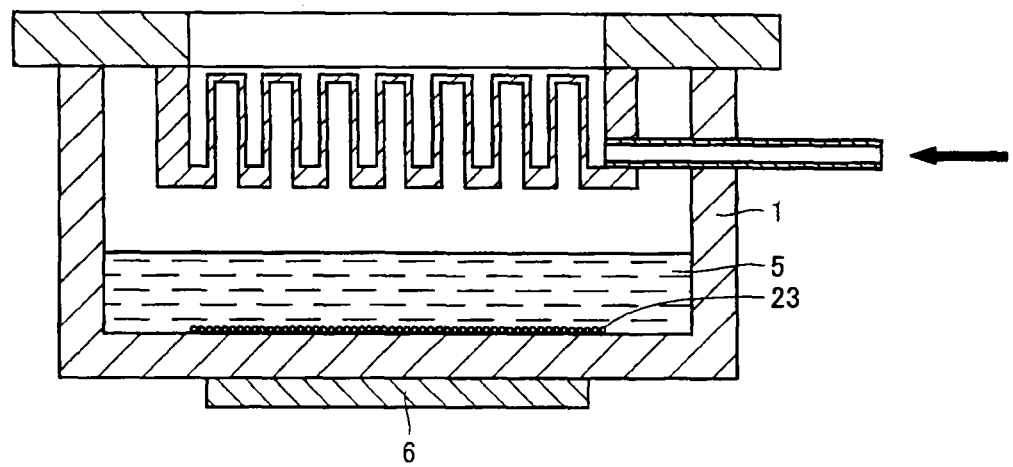
FIG. 11 is a cross section of a heat equalizer in a seventh embodiment.

FIG. 11 is a cross section of a heat equalizer in a seventh embodiment. While the sixth embodiment above has been described in which the heat equalizer has fin body 22 formed on the inner surface of the bottom of outer container 1, a boiling promoter 23 may be placed on the inner surface of the bottom of outer container 1 as shown in FIG. 11.

This boiling promoter 23 is formed using, for example, metal mesh, sintered body of metal powder, or the like. Boiling promoter 23 enables working fluid 5 to boil efficiently. Therefore, the thermal response of heat equalizer can further be improved, increase of the surface temperature of outer container 1 heated by heating means 6 can further be suppressed, and the amount of heat dissipation from the container structure to the peripheral area is further reduced. Accordingly, the heat equalizer with improved energy saving can be obtained.

Eighth Embodiment

Figure 12:
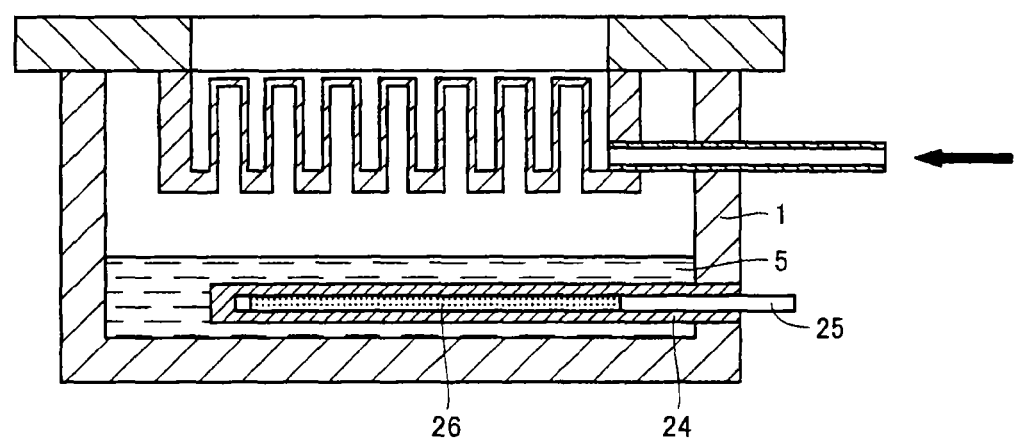
FIG. 12 is a cross section of a heat equalizer in an eighth embodiment.

FIG. 12 is a cross section of a heat equalizer in an eighth embodiment. While the first to seventh embodiments above have been described in which heating means 6 is placed on the outer surface of the bottom of outer container 1, one end of a heater housing tube 24 may be joined and secured to a lower portion of outer container 1 and the other end of heater housing tube 24 may be immersed in working fluid 5 in outer container 1 as shown in FIG. 12. As shown in FIG. 12, in the eighth embodiment, a heater 25 having a heat generating portion 26 is housed in heater housing tube 24, and heat generating portion 26 is placed away from that one end of heater housing tube 24.

In this way, working fluid 5 can be heated directly by means of heater housing tube 24. Further, heat generating portion 26 of heater 25 is located away from the joint portion between heater housing tube 24 and outer container 1, so that the influence of heat transfer from heater 25 to outer container 1 can be lessened and thus heat dissipation from outer container 1 to the surrounding area can be considerably suppressed. Further, since working fluid 5 is evaporated speedily, the thermal response of the heat equalizer can be considerably improved.

Ninth Embodiment

Figure 13:
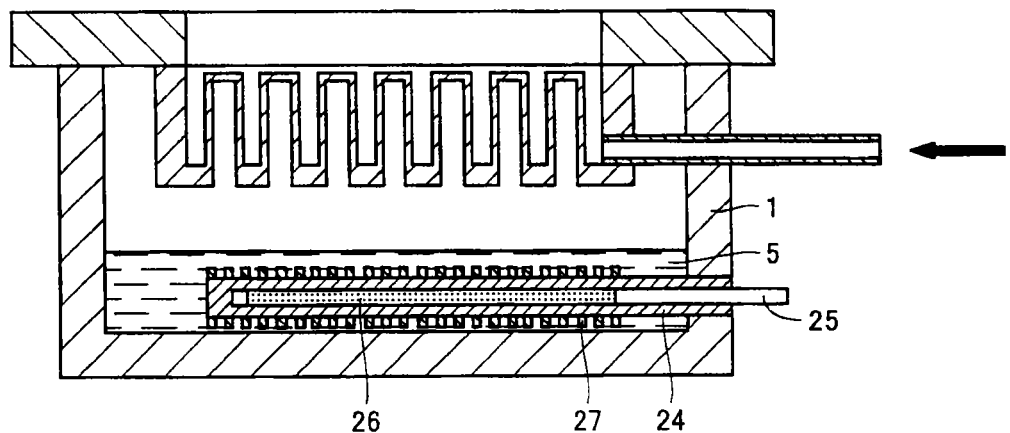
FIG. 13 is a cross section of a heat equalizer in a ninth embodiment.

FIG. 13 is a cross section of a heat equalizer in a ninth embodiment. While the eighth embodiment above has been described in which heater housing tube 24 is placed in outer container 1 for heating working fluid 5, a fin body 27 may be formed on the outer surface of heater housing tube 24 as shown in FIG. 13.

In this way, heat is transferred more efficiently from heater 25 to working fluid 5, and the working fluid is evaporated more speedily. Accordingly, the thermal response of the heat equalizer can further be improved.

Tenth Embodiment

Figure 14:
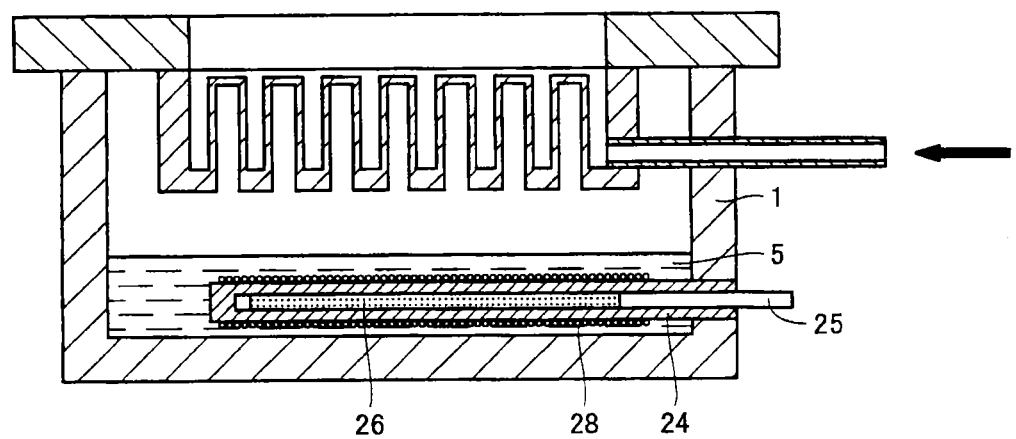
FIG. 14 is a cross section of a heat equalizer in a tenth embodiment.
Figure 15:
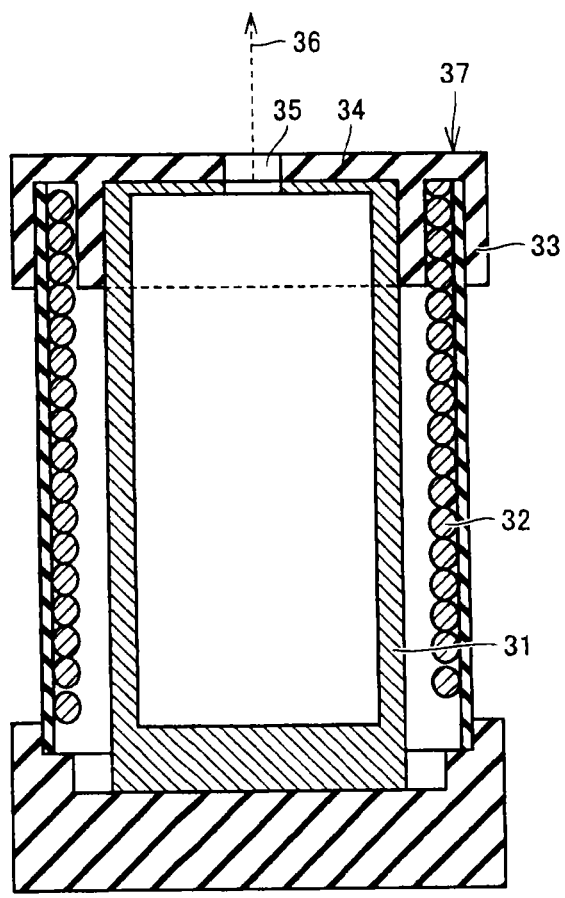
FIG. 15 is a schematic configuration diagram for illustrating a conventional evaporation apparatus.

FIG. 14 is a cross section of a heat equalizer in a tenth embodiment. While the ninth embodiment above has been described in which heater housing tube 24 on which fin body 27 is formed is placed in outer container 1 for heating working fluid 5, a boiling promoter 28 may be formed on the outer surface of heater housing tube 24 as shown in FIG. 14.

In this way, working fluid 5 is heated by heater 25 more efficiently, and working fluid 5 is still more speedily evaporated from the surface of boiling promoter 28. Therefore, the thermal response of the heat equalizer can further be improved.

While the series of embodiments above have been described in which the container structure has a quadrilateral shape as seen in plan view, the shape of the container structure is not limited to the quadrilateral and may alternatively be any polygon or circle.

For heating means 6, electrical heating, induction heating, hot water heating, or vapor heating or the like may be used. The heating system is not limited to a particular one.

Although material feed pipe 12 extends through a side of outer container 1 to be connected to inner container 2 or main header pipe 17 in the examples illustrated above, the passage of material feed pipe 12 is not limited to a particular one. Material feed pipe 12 may extend from the lower surface of outer container 1 to reach main header pipe 17, or may extend through a feed hole formed in flange 3 to reach main header pipe 17. Material feed pipe 12 may extend along any passage.

As for the direction of extension of main header pipe 17, branch header pipe 18, and riser pipe 19 included in the flow path for the material to be heated, as well as depression 11 formed in inner container 2 and depression 20 formed in heating block 16, the direction as described is defined as horizontal direction or vertical direction. The direction along which the flow path and the depressions extend, however, may not be exactly parallel with the horizontal or vertical direction, and may be inclined instead. Further, the flow path and the depressions are not limited to linear pipe or linear pit, and may include a bent or curved pipe or hole. Depressions 11, 20 each are not limited to a circular hole having a circular cross section, and may have any shape which may for example be rectangle hole.

While the embodiments of the present invention have been explained, respective features of the embodiments may be combined as appropriate. It should be construed that the embodiments disclosed herein are by way of illustration in all respects, not by way of limitation. It is intended that the scope of the present invention is defined by claims, not by the above description of the embodiments, and includes all modifications and variations equivalent in meaning and scope to the claims.

INDUSTRIAL APPLICABILITY

The present invention is suitable for an evaporation source of an evaporation apparatus that heats a material which is a predetermined material carried in a container to melt and evaporate the material, so that a film of the material to be vapor-deposited is formed on a surface of a substrate.

The invention claimed is:

1. A heat equalizer comprising:
a container structure including an outer container with a closed space which is formed in said outer container and in which a working fluid is held;
heating means placed at a bottom of said outer container; and
a pipe channel in which a material to be heated flows, said pipe channel including:
  a material feed pipe allowing an outside and an inside of said container structure to communicate with each other;
  a main header pipe connected to said material feed pipe and extending in a horizontal direction;
  branch header pipes branching from said main header pipe and extending in the horizontal direction;
  a plurality of riser pipes branching from said branch header pipes and opening at an upper surface of said container structure,
  a heater housing tube having one end secured to said outer container and the other end immersed in the working fluid of liquid state; and
  a heater housed in said heater housing tube and having a heat generating portion, wherein
said heat generating portion is placed away from said one end of said heater housing tube that is secured to said outer container.

2. The heat equalizer according to claim 1, wherein said heating means is in thermal contact with an outer surface of said outer container.

3. The heat equalizer according to claim 1, wherein a fin body is formed at an inner surface of the bottom of said outer container.

4. The heat equalizer according to claim 1, wherein a boiling promoter is placed at an inner surface of the bottom of said outer container.

5. The heat equalizer according to claim 1, wherein a fin body is formed at an outer surface of said heater housing tube.

6. The heat equalizer according to claim 1, wherein a boiling promoter is placed at an outer surface of said heater housing tube.

* * * * *